United States Patent
Reinhold et al.

(10) Patent No.: US 6,587,062 B1
(45) Date of Patent: Jul. 1, 2003

(54) FLEXIBLE INTERFACE CIRCUIT AND METHOD FOR DELTA SIGMA A/D CONVERTERS

(75) Inventors: Michael Reinhold, Bavaria (DE); Miroslav Oljaca, Tucson, AZ (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/105,701

(22) Filed: Mar. 25, 2002

Related U.S. Application Data

(60) Provisional application No. 60/344,160, filed on Dec. 27, 2001.

(51) Int. Cl.[7] .................................................. H03M 3/00
(52) U.S. Cl. ......................... 341/143; 341/155; 341/77
(58) Field of Search ................................ 341/143, 155, 341/77, 61

(56) References Cited

U.S. PATENT DOCUMENTS

| | | | | |
|---|---|---|---|---|
| 5,515,046 | A | * 5/1996 | Mandl | 341/143 |
| 5,646,621 | A | * 7/1997 | Cabler et al. | 341/143 |
| 5,923,273 | A | * 7/1999 | Pastorello | 341/77 |
| 5,963,160 | A | * 10/1999 | Wilson et al. | 341/143 |
| 6,215,423 | B1 | * 4/2001 | May et al. | 341/61 |
| 6,271,781 | B1 | * 8/2001 | Pellon | 341/143 |
| 6,417,792 | B1 | * 7/2002 | King et al. | 341/143 |

OTHER PUBLICATIONS

"Overview of HP's Optical Isolation Technology and Products for Motor Control Applications—Solution Note 101", Hewlett Packard, 1996, pp. 1–10.

"Isolated 15–bit A/D Converter—Technical Data", HCPL–7860/HCPL–786J,HCPL–0870, –7870, Agilent Technologies, 2000, pp. 1–30.

"Isolated Amplifier with Short Circuit and Overload Detection—Technical Data", HCPL–788J, Agilent Technologies, 1999, pp. 1–20.

"Designing with Agilent Technologies Isolation Amplifiers—Application Note 1078", Agilent Technologies, 1999, pp. 1–14.

"High CMR Isolation Amplifier for Current Sensing Applications—Application Note 1059", Agilent Technologies, 1999, pp. 1–12.

* cited by examiner

Primary Examiner—Jean Bruner Jeanglaude
(74) Attorney, Agent, or Firm—W. Daniel Swayze, Jr.; W. James Brady; Frederick J. Telecky, Jr.

(57) ABSTRACT

A multi-mode interface circuit for coupling a delta sigma modulator (24) to a processor includes a decoder 20 for decoding mode selection inputs to produce a plurality of control signals controlling an oscillator and a plurality of multiplexers. The oscillator is enabled to produce a first clock signal (INTCLK). The first clock signal or an external clock signal (EXTCLK) is multiplexed as a second clock signal (40) to the input of a code generator circuit (23), causing it to generate a clock input signal (MCLK) applied the delta sigma modulator, third and fourth clock signals (41, 42), and a phase-shift-modulated signal (43) in response to both the second clock signal and a 1-bit data signal (MDAT) produced by the delta sigma modulator. One of the third and fourth clock signals and a ground signal is multiplexed to a clock conductor (13). The phase-shift-modulated signal or the 1-bit data signal is multiplexed onto a data output conductor (14).

28 Claims, 7 Drawing Sheets

MODE 0:

MODE 1:

MODE 2: *FIG. 4*
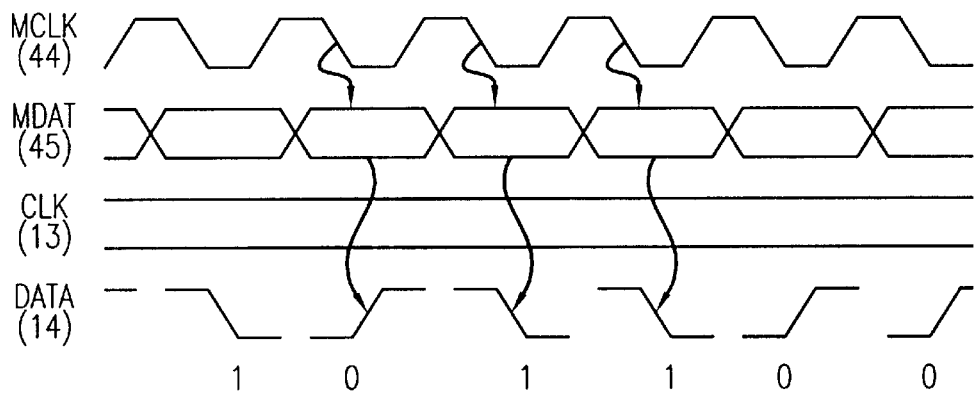
MODE 3: *FIG. 5*
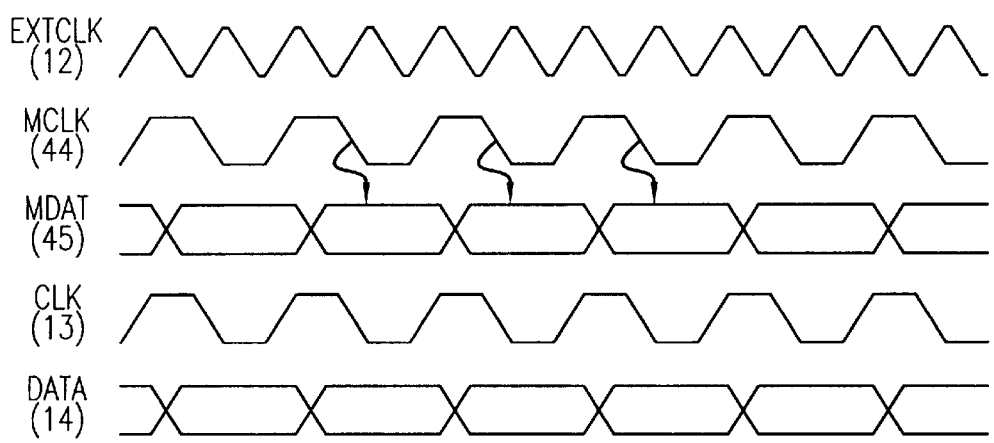

FLEXIBLE INTERFACE CIRCUIT AND METHOD FOR DELTA SIGMA A/D CONVERTERS

This application claims the benefit of prior filed U.S. provisional application Serial No. 60/344,160 filed Dec. 27, 2001 entitled "FLEXIBLE INTERFACE CIRCUIT AND METHOD FOR DELTA SIGMA A/D CONVERTERS" by Michael (nmi) Reinhold and Miroslav (nmi) Oljaca.

BACKGROUND OF THE INVENTION

The invention relates to a method and circuit for providing convenient, multi-mode interfacing between a delta sigma modulator and another device, such as a digital signal processor (DSP) or a digital filter coupled to a DSP.

Ordinarily, only 2 signals are utilized for communication between a delta sigma modulator and a DSP or other processor or a digital filter such as a decimation filter. For example, one of the signals could be an external clock signal generated by the DSP, and the other signal could be a data output signal generated by the delta sigma modulator. The clock signal is required in addition to the data signal because it is necessary to have a clock signal synchronized to the 1-bit serial data signal generated by a delta sigma modulator in order to convert its 1-bit serial data output signal to a more useful multi-bit word of predetermined resolution.

In the closest prior art, the clock signal and data signal are carried by first and second conductors, respectively, which are directly connected between the delta sigma modulator and a DSP (or other processor, such as a microcontroller). This direct connection technique works effectively and economically if the transducer and delta sigma modulator do not need to be electrically isolated from the DSP. However, in many applications the transducer to be measured is electrically "floating" at a level that may be hundreds or even thousands of volts above or below the ground level of the DSP or other processor. Consequently, for safety reasons and other reasons, it often is necessary for the transducer and the delta sigma modulator to be electrically isolated from the processor (or a digital filter which would be connected in front of the processor to convert the serial 1-bit data output signal produced by the delta sigma modulator to a more useful multi-bit digital word). The electrical isolation often is accomplished by a pair of optical couplers (or other galvanic isolation devices such as isolation transformers, isolation barrier capacitors, or isolating transistor level shift circuits), one optical coupler being used to couple the clock signal of the delta sigma modulator to or from the processor and the other optical coupler being used to couple the 1-bit serial delta sigma output data signal to an input of the processor. However, it is undesirable to be required to use two optical couplers or two other galvanic isolation devices, because optical couplers and other galvanic isolation devices are very expensive.

Thus, there is an unmet need for a convenient, flexible, inexpensive interface between a delta sigma modulator and a processor (such as a DSP or microcontroller) or a digital filter coupled to an input of the processor.

There also is an unmet need for a way of avoiding the need to use two expensive optical couplers or two other galvanic isolation devices to accomplish analog-to-digital conversion of an analog signal produced by a transducer that is referenced to a first ground voltage and providing the digital output as an input to a processor and/or digital filter that is referenced a second ground voltage which may be very different from the first ground voltage.

There also is an unmet need for a circuit and method that provides synchronized digital signals produced by analog-to-digital conversion of a plurality of analog transducer output signals or the like as inputs to a processor.

There also is an unmet need for a circuit and method for providing communication between a processor and a plurality of delta sigma ADCs coupled to perform analog-to-digital conversion of the outputs of a plurality of transducers or the like using a minimum number of conductors coupled between the processor and the delta sigma ADCs.

SUMMARY OF THE INVENTION

Accordingly, it is an object of the invention to provide a multi-mode delta sigma modulator circuit including a flexible interface circuit which is capable of a number of selectable operating modes for coupling its clock input signal and its 1-bit serial data output signal to a digital filter or DSP or other processor for any of a variety of user applications.

It is another object of the invention to provide a multi-mode interface circuit which is capable of a number of selectable operating modes for coupling its clock input signal and its 1-bit serial data output signal to a digital filter or DSP or other processor for any of a variety of user applications.

It is another object of the invention to provide a multi-mode interface circuit which is selectively capable of coupling both clock input information and digital output information of a delta sigma modulator through only a single conductor to a digital filter or DSP or other processor.

It is another object of the invention to provide a multi-mode interface circuit which is capable of coupling both clock input information and digital output information of a delta sigma modulator through only a single optical coupler or other galvanic isolation device to a digital filter or a DSP or other processor, wherein the delta sigma modulator has an analog input coupled to an electrically floating transducer or the like.

Briefly described, and in accordance with one embodiment thereof, the invention provides a multi-mode interface circuit (1) for coupling a delta sigma modulator (24) to a processor or a digital filter (37). The interface circuit (1) includes a decoder 20 for decoding a plurality of mode selection inputs to produce a plurality of control signals (30–32,33-1,33-2). An oscillator (21) is enabled by a first control signal (30) from the decoder to produce a first internal clock signal (INTCLK). A first multiplexer (22) selectively switches the first internal clock signal (INTCLK) or an external clock signal (EXTCLK) onto a first conductor (40) to produce a second internal clock signal (40) thereon. A code generator circuit (23) receives the second internal clock signal (40) and a 1-bit data signal (MDAT) produced by the delta sigma modulator (24), and generates a clock input signal (MCLK) applied to a clock input of the delta sigma modulator (24), a third internal clock signal (41), and a fourth internal clock signal (42). The code generator circuit also generates a phase-shift-modulated signal (43) in response to both the second internal clock signal (40) and the 1-bit data signal(MDAT). A second multiplexer (25) selectively switches one of the third (41) and fourth (42) clock signals, and a predetermined signal onto a clock conductor (13) to produce an output clock signal (CLK) thereon. The second multiplexer (25) also selectively switches the external clock signal (EXTCLK) which, if present, is externally applied to the clock conductor (13), from the clock conductor (13) to an input of the first multiplexer (22). A third multiplexer (26) selectively switches the phase-shift-modulated signal (43) or the 1-bit data signal (MDAT) onto a data output conductor (14) to produce a data output signal (DATA) thereon.

In the described embodiment, the code generator circuit produces the clock input signal (MCLK) in response to the second internal clock signal (40). The code generator circuit includes a divider circuit that divides the clock input signal (MCLK) by 2 to produce the third internal clock signal (41) and divides the clock signal (MCLK) by 4 to produce the fourth internal clock signal (42). The code generator circuit also includes a phase-shift-modulator circuit (23B) that phase-shift-modulates the clock input signal (MCLK) according to the 1-bit data signal (MDAT) to produce the phase-shift-modulated signal (43).

The decoder has first (M0) and second (M1) mode selection inputs. The decoder decodes a first state (0,0) of the first and second mode selection inputs to establish a first mode (Mode 0) wherein a first control signal (30) enables the oscillator (21) to produce the first internal clock signal (INTCLK), a second control signal (31) causes the first multiplexer (22) to switch the first internal clock signal (INTCLK) to the first conductor (40) causing the code generator circuit to produce the clock input signal (MCLK) in response to the first internal clock signal (INTCLK), a third control signal (33-1) causes the second multiplexer (25) to switch the third internal clock signal (41) onto the output clock conductor (13) to produce the output clock signal (CLK) equal to the third internal clock signal (41= INTCLK/2), and a fourth control signal (32) causes the third multiplexer (26) to switch the 1-bit data signal (MDAT) onto the data output conductor (14).

The decoder decodes a second state (0,1) of the first and second mode selection inputs to establish a second mode (Mode 1) wherein the first control signal (30) enables the oscillator (21) to produce the first internal clock signal (INTCLK), the second control signal (31) causes the first multiplexer (22) to switch the first internal clock signal (INTCLK) to the first conductor (40) causing the code generator circuit to produce the clock input signal (MCLK) in response to the first internal clock signal (INTCLK), the third control signal (33-1) causes the second multiplexer (25) to switch the fourth internal clock signal (42) onto the output clock conductor (13) to produce the output clock signal (CLK) equal to the fourth internal clock signal (41), and the fourth control signal (32) causes the third multiplexer (26) to switch the 1-bit data signal (MDAT) onto the data output conductor (14).

The decoder decodes a third state (1,0) of the first and second mode selection inputs to establish a third mode (Mode 2) wherein the first control signal (30) enables the oscillator (21) to produce the first internal clock signal (INTCLK), the second control signal (31) causes the first multiplexer (22) to switch the first internal clock signal (INTCLK) to the first conductor (40) causing the code generator circuit to produce the clock input signal (MCLK) in response to the first internal clock signal (INTCLK), a fifth control signal (33-2) causes the second multiplexer (25) to switch the predetermined signal onto the output clock conductor (13) to cause the output clock signal (CLK) to be equal to the predetermined signal, and the fourth control signal (32) causes the third multiplexer (26) to switch the phase-shift-modulated signal (43) onto the data output conductor (14).

The decoder decodes a fourth state (1,1) of the first and second mode selection inputs to establish a fourth mode (Mode 3) wherein the first control signal (30) disables the oscillator (21), wherein the second control signal (31) causes the first multiplexer (22) to switch the external clock signal (EXTCLK) to the first conductor (40) causing the code generator circuit to produce the clock input signal (MCLK) in response to the external clock signal (EXTCLK), the fifth control signal (33-2) causes the second multiplexer (25) to switch the to the output clock conductor (13) to an input of the first multiplexer (22). The fourth control signal (32) causes the third multiplexer (26) to switch the 1-bit data signal (MDAT) onto the data output conductor (14).

BRIEF DESCRIPTION OF THE DRAWINGS

FIG. 4 is a timing diagram useful in describing a third mode of operation of the interface circuit of FIG. 1.

FIG. 5 is a timing diagram useful in describing a fourth mode of operation of the interface circuit of FIG. 1.

DETAILED DESCRIPTION OF THE PREFERRED EMBODIMENTS

Figure 1:
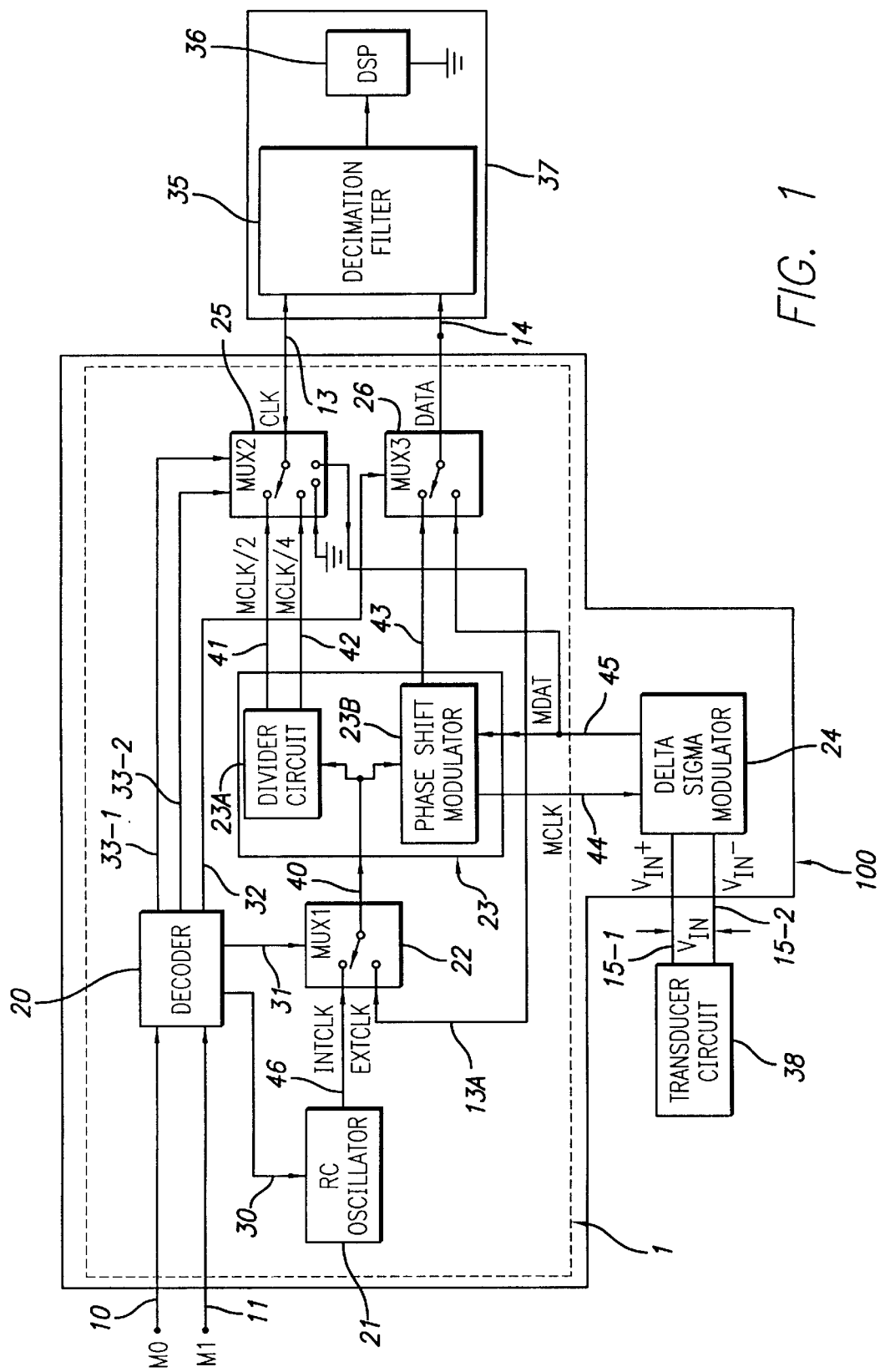
FIG. 1 is a schematic diagram including a flexible interface circuit according to the present invention.

Referring to FIG. 1, reference numeral 100 designates a 1-bit delta sigma analog-to-digital converter (ADC) that is a combination of a delta sigma modulator 24 and an interface circuit 1. The delta sigma ADC 100 can be provided on a single integrated circuit chip.

In the described embodiment, delta sigma modulator 24 is a second-order delta sigma modulator having 10 MHz sampling of the analog input signal. (However, delta sigma modulator 24 can be of any order and can have its analog input signal sampled at any suitable rate.) The analog input signal as shown in FIG. 1 is a differential input signal $V_{IN}$ equal to the difference between the signal $V_{IN+}$ applied to conductor 15-1 and the signal $V_{IN-}$ applied to conductor 15-2. $V_{IN}$ can be a differential output signal produced by a transducer circuit 38 (or by any other device). It should be understood that $V_{IN}$ may be electrically "floating" at a large voltage, e.g., hundreds or even thousands of volts above or below the ground voltage of a processor 37 (which can include a digital filter 35 coupled between a DSP 36 and delta sigma ADC 100) that utilizes information obtained by measurement of an analog-to-digital conversion of $V_{IN}$. Delta sigma modulator 24 has a clock input terminal connected to conductor 44 to receive a clock signal MCLK that is produced by interface circuit 1. Delta sigma modulator 24 also has a data output terminal connected to conductor 45 to provide a 1-bit serial data output signal MDAT as an input to the interface circuit 1, where MDAT represents the present value of $V_{IN}$. (Note that this is in contrast to the above mentioned prior art, wherein conductors 44 and 45 would be connected directly to a processor). Processor 37 is illustrated as a generalized processing device that includes DSP 36 and decimation filter 35 coupled between the delta sigma ADC 100 and DSP 36. However, it should be understood that processor 37 can be any kind of computing device, such as a microprocessor or a microcontroller, and can include a digital filter, such as decimation filter 35.

Interface circuit 1 produces a clock signal CLK on conductor 13, which, as shown in FIG. 1, is connected to a corresponding input of a decimation filter 35 that is interposed between delta sigma modulator 24 and DSP 36. Interface circuit 1 also produces a corresponding data signal DATA on conductor 14, which is connected to a corresponding input of the decimation filter 35. Alternatively, the CLK and DATA signals can be directly connected to (or indirectly coupled, e.g., by one or more optical couplers or other galvanic isolation devices) to corresponding inputs of DSP 36. Decimation filter 35 together with 1-bit delta sigma ADC 100 as shown in FIG. 1 provides a multi-bit delta sigma ADC that can provide a multi-bit output that is more useful to DSP 36.

In accordance with the present invention, interface circuit 1 is a flexible, multi-mode interface circuit which is coupled between delta sigma modulator 24 and processor 37. Interface circuit 1 includes a decoder 20 which receives mode control inputs M0 on conductor 10 and M1 on conductor 11. In response to M0 and M1, decoder 20 produces control signals on decoder output conductors 30, 31, 32, 33-1 and 33-2. A control signal on conductor 30 enables an RC oscillator circuit 21 to produce a first internal clock signal INTCLK on conductor 46, which is connected to the first input of a first multiplexer circuit 22. A second input of multiplexer 22 is connected to conductor 13A on which a clock signal EXTCLK is applied by means of multiplexer 25 during one of the selectable modes wherein EXTCLK is externally applied to CLK conductor 13. Output conductor 31 of decoder 20 is connected to the control input of multiplexer 22 to determine which of the first internal clock INTCLK and the external clock EXTCLK is produced as a second internal clock signal on output conductor 40 of multiplexer 22 and applied to an input of a code generator circuit 23.

Code generator circuit 23 couples the first internal clock signal on conductor 40 to one input of a phase shift modulator circuit 23B. Phase shift modulator circuit 23B generates the signal MCLK on conductor 44 in response to the second internal clock signal on conductor 40, as subsequently explained with reference to FIG. 9. MCLK is applied to the clock input terminal of delta sigma modulator 24. MCLK is derived from either INTCLK (in Modes 0,1,2) or EXTCLK (in Mode 3), depending on which mode is selected by decoder 20. Code generator circuit 23 includes divider circuitry 23A which in effect divides MCLK by 2 to produce a third internal clock signal MCLK/2 on conductor 41, and also in effect divides MCLK by 4 to produce a fourth internal clock signal MCLK/4 on conductor 42.

Phase shift modulator circuitry 23B (subsequently described with reference to FIG. 9) has another input connected to receive the MDAT signal on conductor 45, and in Mode 2 functions to phase-shift-modulate MCLK according to the information represented by MDAT, to thereby produce a corresponding phase-shift-modulated data signal on conductor 43.

Output conductor 32 of decoder 20 is connected to the control input of multiplexer 26. Multiplexer 26 includes a first input connected by output conductor 43 of code generator circuit 23 to receive the phase-shift-modulated data signal produced by phase-shift-modulator circuit 23B. Multiplexer 26 also includes a second input connected to conductor 45 to receive the delta sigma modulator 1-bit output signal MDAT. The output of multiplexer 26 is connected by conductor 14 to conduct the output signal DATA (which represents the present value of $V_{IN}$) to a data input of processor 37.

Output conductors 33-1 and 33-2 of decoder 20 are connected to corresponding control inputs of a multiplexer 25. Multiplexer 25 has a first input connected by conductor 41 to receive the third internal clock signal MCLK/2 from an output of divider circuit 23A, a second input connected by conductor 42 to receive the fourth internal clock signal MCLK/4 from another output of divider circuit 23A, a third input connected to a predetermined ground signal, and a fourth terminal connected to conductor 13A. Thus, multiplexer 25 produces an output signal CLK on output clock conductor 13 that is equal to the selected one of MCLK/2 (for Mode 0 or Mode 3), MCLK/4 (for Mode 1), or ground (for Mode 2). In Mode 3, the open input of multiplexer 25 can be selected by conductor 33-2, allowing an external clock signal EXTCLK to be forced onto conductor 13 so that the signal on conductor 13A and the internal clock signal on conductor 40 are equal to EXTCLK.

In operation, decoder 20 decodes the four possible states defined by control inputs M0 and M1 to select one of the above mentioned 4 operating modes, referred to as Mode 0, Mode 1, Mode 2 and Mode 3, which are defined in Table 1.

TABLE 1

| | Mode Definition | M0 | M1 |
| --- | --- | --- | --- |
| Mode 0 | Internal clock, synchronous data output | low | low |
| Mode 1 | Internal clock, synchronous data output, half-frequency output clock | low | high |
| Mode 2 | Internal clock, Manchester-coded data output | high | low |
| Mode 3 | External clock, synchronous data output | high | high |

In Mode 0, both M0 and M1 are at "0" levels, which causes decoder 20 to produce an oscillator enable signal on conductor 30. This enables RC oscillator 21 to produce the first internal clock signal INTCLK on conductor 46. Decoder 20 also produces a select signal on conductor 31 that causes multiplexer 22 to switch INTCLK onto conductor 40 and apply it as the second internal clock signal to the input of code generator 23. In response to INTCLK, code generator 23 produces the clock signal MCLK, which in Mode 0 is identical to INTCLK, on conductor 44 and apply it to the clock input terminal of delta sigma modulator 24. Divider circuit 23A produces the third internal clock signal MCLK/2 on conductor 41. Decoder 20 also produces a select signal on conductor 33-1, causing multiplexer 25 to switch the third internal clock signal MCLK/2 on conductor 41 onto conductor 13, so the clock signal CLK is equal to MCLK/2. Decoder 20 also produces another select signal on conductor 32, causing multiplexer 26 to switch the delta sigma modulator 1-bit output signal MDAT onto conductor 14 to produce the signal DATA. Thus, in Mode 0, the signal CLK on conductor 13 is equal to MCLK/2, and the signal DATA on conductor 14 is equal to MDAT.

Figure 2:
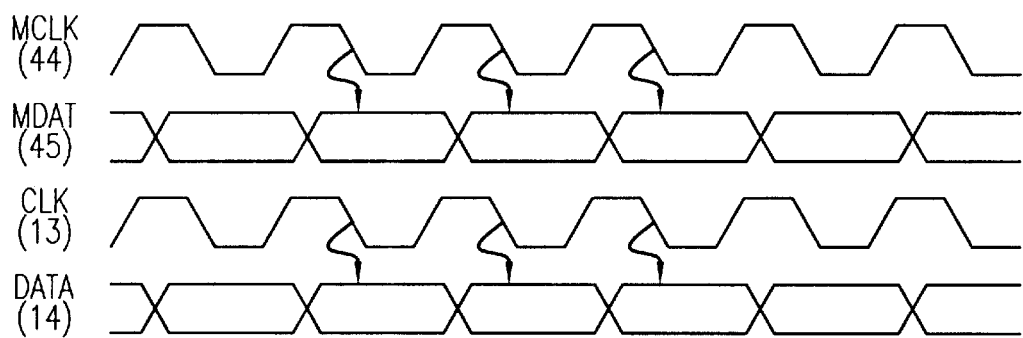
FIG. 2 is a timing diagram useful in describing a first mode of operation of the interface circuit of FIG. 1.

FIG. 2 illustrates the MCLK, MDAT, CLK, and DATA waveforms for Mode 0 operation. The upper arrows pointing from the from the falling edges of the MCLK waveforms to the level sections of of the MDAT waveform indicate that the levels of MDAT are valid during the falling edges of MCLK. The lower arrows pointing from the falling edges of the CLK waveform to the level sections of the DATA waveform indicate that the processor 37 reads the information of the DATA waveform on every falling edge of the output clock CLK.

In Mode 1, M0 is at a "1" level and M1 is at a "0" level. This causes decoder 20 to operate the same as in Mode 0, i.e., to enable RC oscillator 21, causing it to produce INTCLK on conductor 46. Decoder 20 produces a select signal on conductor 31 that causes multiplexer 22 to switch INTCLK onto conductor 40 and into the clock input of code generator 23. Decoder 20 also produces a select signal on conductor 33-1 which causes multiplexer 25 to switch the signal MCLK/4 (rather than CLK/2 as in Mode 0) onto conductor 13. Decoder 20 also produces the same select signal as in Mode 0 on conductor 32, causing multiplexer 26 to switch MDAT onto conductor 14. Thus, in Mode 1 the CLK signal on conductor 13 is equal to MCLK/4, and the DATA signal on conductor 14 is equal to MDAT (which is the same as in Mode 0).

Figure 3:
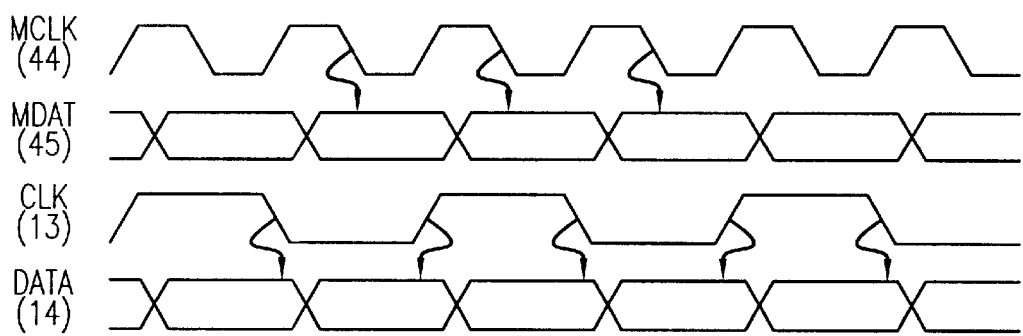
FIG. 3 is a timing diagram useful in describing a second mode of operation of the interface circuit of FIG. 1.

FIG. 3 illustrates the MCLK, MDAT, CLK, and DATA waveforms for Mode 1 operation. Note that in FIG. 3 in the frequency of CLK is half that in FIG. 2. As in FIG. 2, the upper arrows in FIG. 3 pointing from the from the falling edges of the MCLK waveforms to the level sections of the MDAT waveforms indicate indicate that the levels of MDAT are valid during the falling edges of MCLK. The lower arrows pointing from both the rising and falling edges of the CLK waveform to the level sections of the DATA waveform indicate that the processor 37 reads the information of the DATA waveform on every rising edge and also on every falling edge of the output clock CLK.

In Mode 2, M0 is at a "0" level and M1 is at a "1" level. As in Mode 0 and Mode 1, decoder 20 both enables RC oscillator 21 to produce INTCLK and also produces a select signal on conductor 31, causing multiplexer 22 to produce INTCLK on conductor 40 and apply it as a clock input to code generator 23. Decoder 20 also produces a select signal on conductor 33-2, which causes multiplexer 25 to connect conductor 13 to the predetermined ground signal. Decoder 20 also produces a select signal on conductor 32 that switches the phase-shift-modulated data/clock signal on conductor 43 onto conductor 14. As previously explained, the signal on conductor 43 is produced by operation of phase-shift-modulator 23B on the phase-shift-modulated MCLK signal according to the values of MDAT. (This is also known as split phase or Manchester coding. Also, other types of modulation, such as twinned binary coding, bipolar coding, etc. could be used.) Thus, in Mode 2 the signal CLK on conductor 13 is at ground, and the signal DATA on conductor 14 is equal to the phase-shift-modulated signal on conductor 43 representing both clock information and data information. The processor 37 therefore derives both the needed clock signal information and the information representing the present value $V_{IN}$ from the signal DATA on the single conductor 14.

FIG. 4 illustrates the MCLK, MDAT, CLK, and DATA waveforms for Mode 2 operation. The CLK waveform is held at a steady "0" level as explained above. The DATA waveform is the above described phase-shift-modulated Manchester coded signal produced by phase-shift-modulator 23B containing both clock information associated with the CLK waveform and data information associated with the MDAT waveform. The upper arrows pointing from the falling edges of the MCLK waveforms to the level sections of the MDAT waveform indicate indicate that the levels of MDAT are valid during the falling edges of MCLK. The lower arrows pointing from the MDAT waveform to the rising and falling edges of the DATA waveform indicate that the processor 37 reads the information based on the relative phase of every rising edge and every falling edge of the DATA waveform.

In Mode 3, M0 and M1 are both at a "1" level, and the circuit operation is identical to that in Mode 0 except that decoder 20 disables RC oscillator 21, and the external clock signal EXTCLK is applied directly onto CLK conductor 13 and through multiplexer 25, conductor 13A and multiplexer 22 to conductor 40. Decoder 20 causes one of conductors 33-1 and 33-2 to cause multiplexer 25 to connect conductor 13 and EXTCLK onto conductor 13A Therefore, MCLK is derived from EXTCLK instead of INTCLK, and the signal DATA on conductor 14 is equal to MDAT. FIG. 5 illustrates the EXTCLK, MCLK, MDAT, CLK, and DATA waveforms for Mode 3 operation. The upper arrows pointing from the from the rising edges of the EXTCLK waveform to the falling and rising edges of the MCLK waveform and the lower arrows pointing from the falling edges of the MCLK waveform to the level sections of the MDAT waveform indicate that the levels of MDAT are valid during the falling edges of MCLK.

Figure 6:
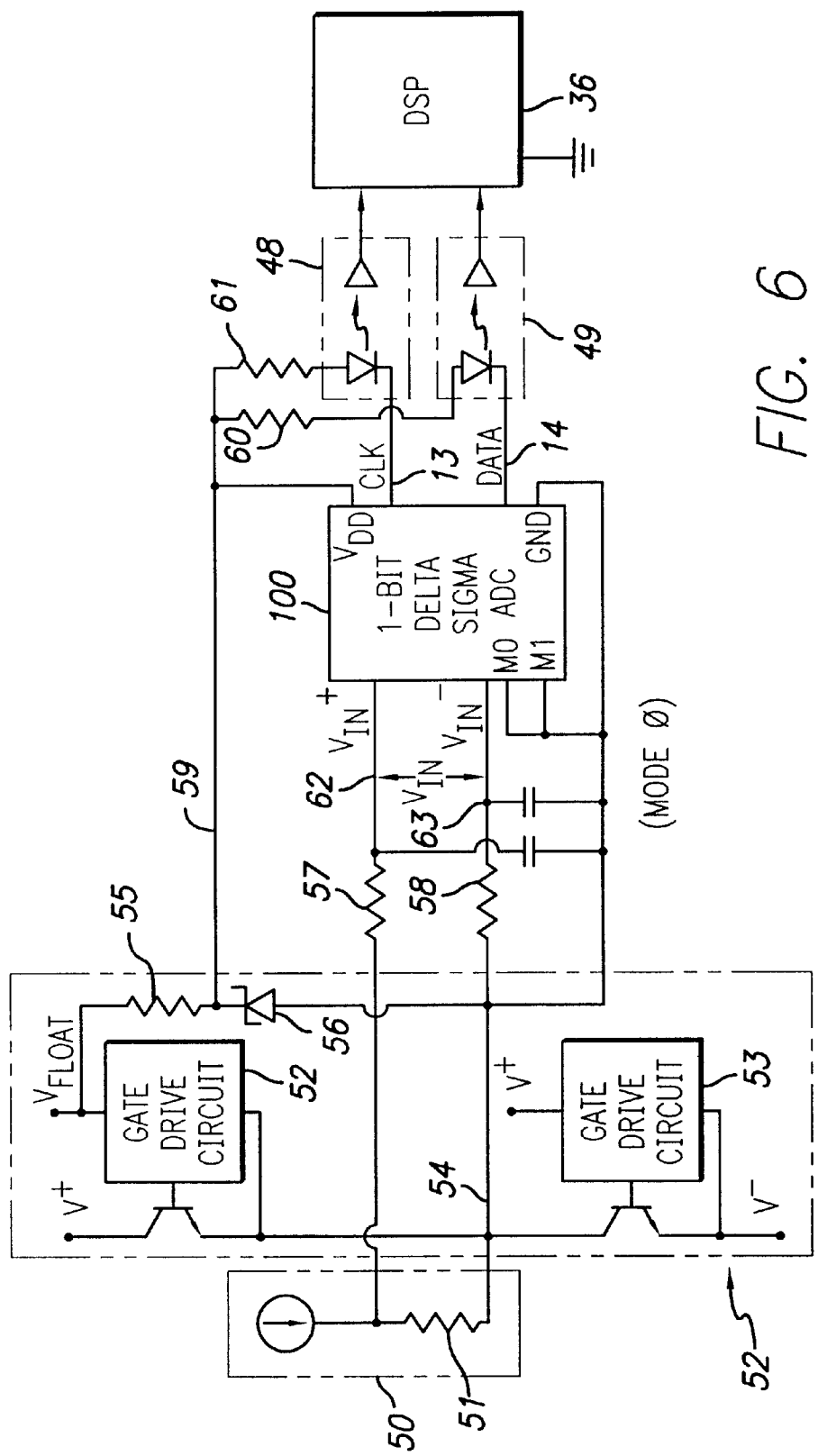
FIG. 6 is a block diagram of a system utilizing the portion 100 of FIG. 1 including the delta sigma modulator and interface circuit to produce a digital representation of an analog transducer signal and supply the digital representation to a DSP by means of a pair of optical couplers during "Mode 0" operation of the interface circuit.

FIG. 6 shows a circuit wherein the 1-bit delta sigma ADC 100 shown in FIG. 1 is set up in a first user application to operate in the above described Mode 0. As explained above, 1-bit delta sigma ADC 100 includes delta sigma modulator 24 and interface circuit 1 of FIG. 1. A transducer 50 (or other device to be measured) is represented by a resister 51 and a series current source. The output signal of transducer 50 is coupled by resisters 57 and 58 so as to cause the differential voltage $V_{IN}$ to be produced between the differential input conductors 62 and 63 of delta sigma ADC 100.

The lower terminal of resister 51 is connected to the ground conductor 54 of 1-bit delta sigma ADC 100. A bias circuit 52 maintains the voltage of ground conductor 54 at a "floating" first ground voltage that is different than a second ground voltage applied to DSP 36. The floating first ground voltage is produced by a circuit including an upper NPN power transistor connected in an emitter follower configuration as a pull-up device and a lower NPN power transistor connected as a pull-down device. (Alternatively, IGBT transistors or MOSFET power transistors could be used.) The upper and lower NPN transistors are biased by corresponding upper and lower gate drive circuits 52 and 53, respectively, so as to perform the function of establishing a desired value of the above mentioned "floating" first ground voltage.

Therefore, conductor 59, which is connected to the $V_{DD}$ supply voltage terminal of delta sigma ADC 100, is maintained at a voltage equal to the voltage of ground conductor 54 plus the voltage drop across Zener diode 56. The mode control signals M0 and M1 are both connected to ground, to establish Mode 0 operation. Therefore, the CLK signal produced in Mode 0 by delta sigma ADC 100 on conductor 13 is applied to an input of a first optical coupler 40, the output of which is connected to DSP 36 (or to a digital filter, as shown in FIG. 1). The data signal DATA representing the present value of $V_{IN}$ produced in Mode 0 by delta sigma ADC 100 on conductor 14 is applied to an input of the second optical coupler 49, the output of which is connected to an input of DSP 36. The circuit shown in FIG. 6 also could be operated in Mode 1.

Figure 7:
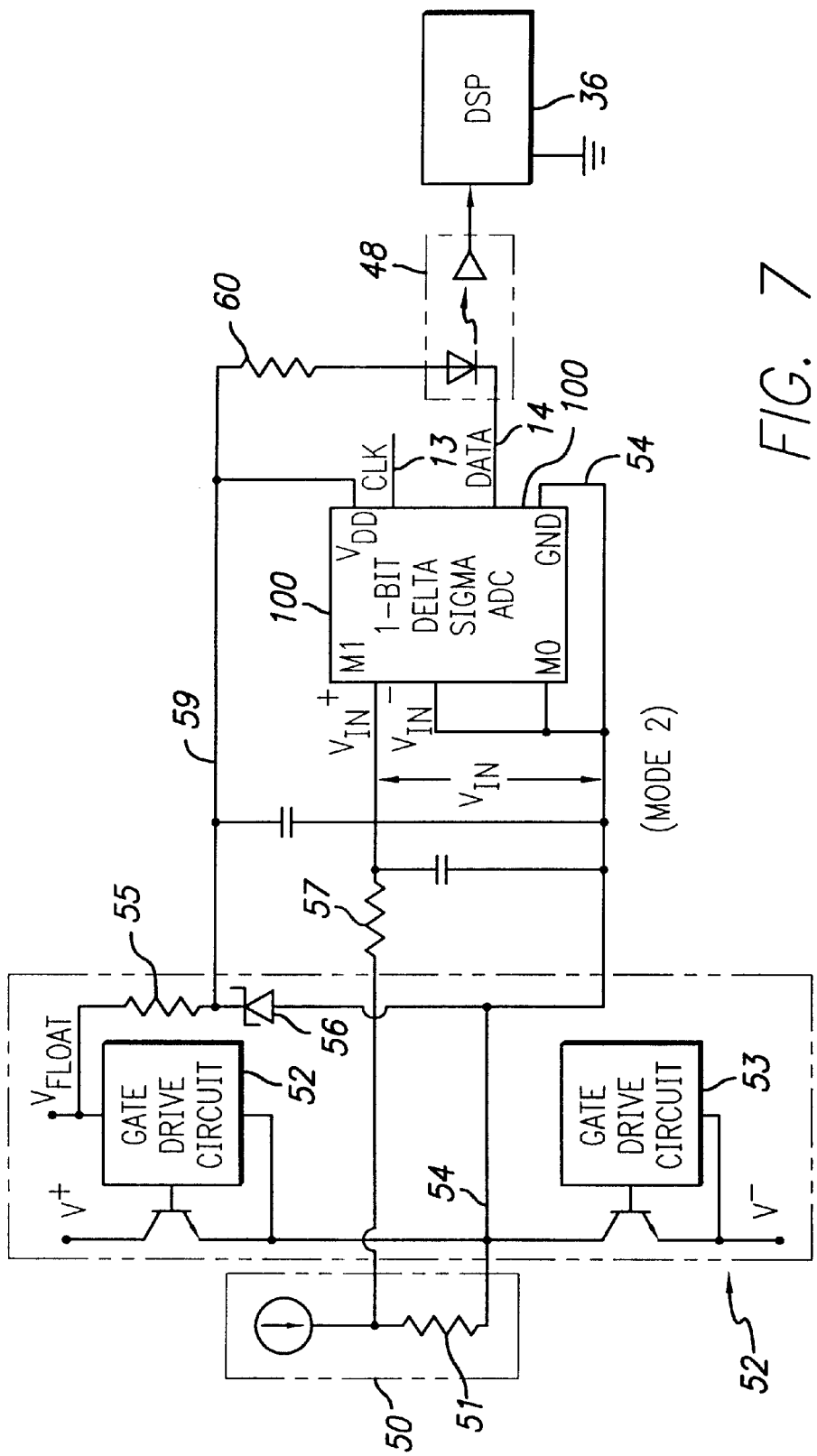
FIG. 7 is a block diagram of a system utilizing the portion 100 of FIG. 1 including the delta sigma modulator and interface circuit to produce a digital representation of an analog transducer signal and supply the digital representation to a DSP by means of a single optical coupler during "Mode 2" operation of the interface circuit.
Figure 8:
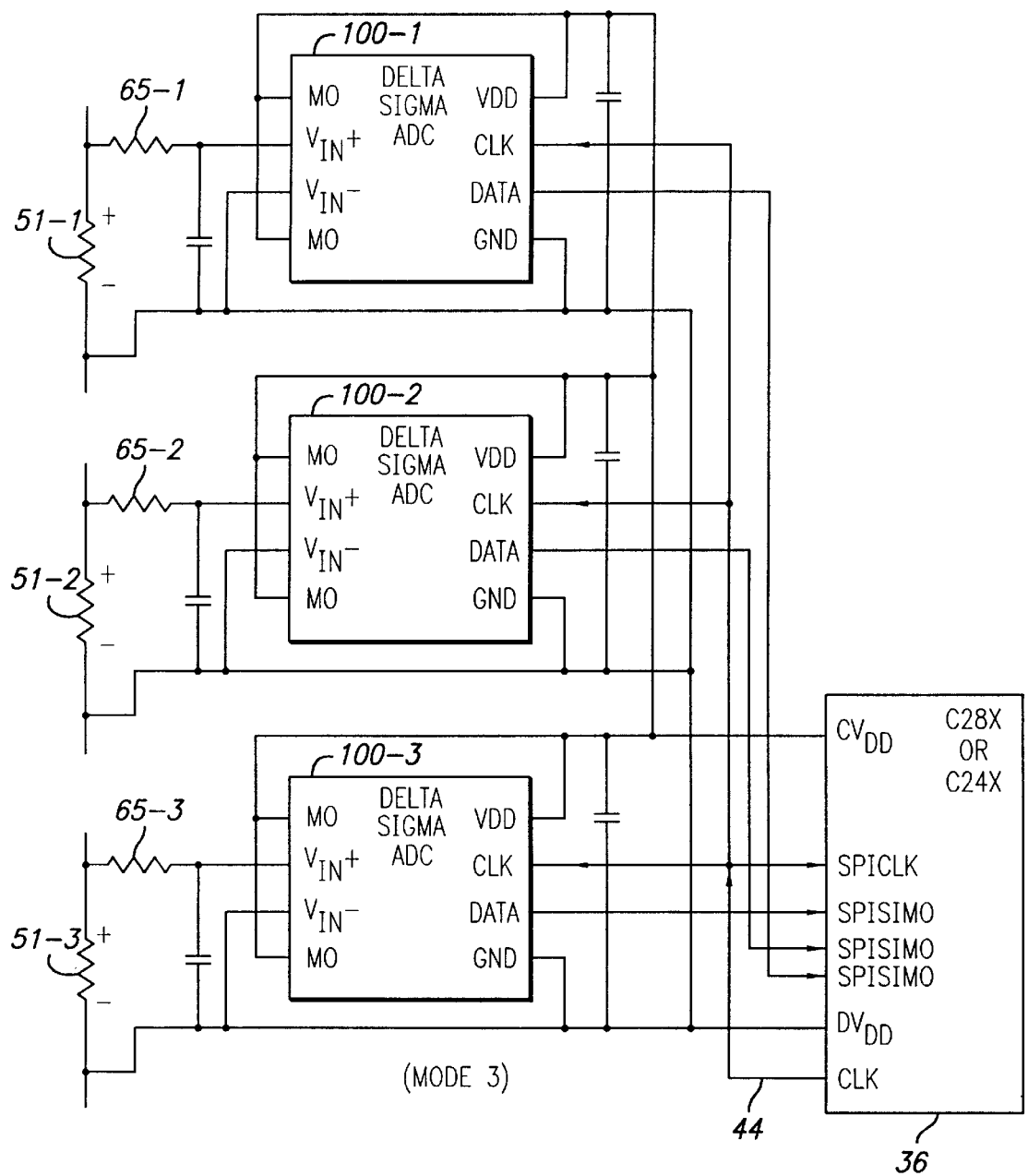
FIG. 8 is a block diagram of a system utilizing three of the delta sigma ADCs 100 of FIG. 1 each including a delta sigma modulator and an interface circuit during "Mode 3" operation to provide synchronized digital representations of the outputs of three transducers to a single DSP.

FIG. 7 shows a circuit wherein the 1-bit delta sigma ADC 100 shown in FIG. 1 is set up in a user application to operate in above described Mode 2. As in FIG. 6, 1-bit delta sigma ADC 100 is connected in an application wherein a transducer 50 (or other device) to be measured is represented by a resister 51 and a series current source. The lower terminal of resister 51 is connected to a "floating" ground conductor 54 connected to the ground input of 1-bit delta sigma ADC 100. Bias circuit 52 in FIG. 8 is essentially the same as in FIG. 6. As in FIG. 6, bias circuit 52 maintains the voltage of electrically floating ground conductor 54 at a bias level that may be much different than ground voltage of DSP 36. The voltage $V_{IN}$ is connected to floating ground conductor 54. Mode selection signal M0 is connected to ground conductor 54, and mode selection signal M1 is connected to supply voltage on conductor 59 to establish Mode 2 operation. The Mode 2 CLK signal produced by delta sigma ADC 100 on conductor 13 is zero.

The signal DATA on conductor 14 includes both clock timing information associated with the Mode 2 internal clock signal (which is INTCLK) and the MDAT signal representing the present value of $V_{IN}$. The signal DATA on conductor 14 is applied to the input of the single optical coupler 48, the output of which is connected to DSP 36 (or a digital filter as shown in FIG. 1). It should be noted that Mode 2 operation is especially useful when the transducer 50 and delta sigma delta sigma ADC 100 are electrically isolated from the DSP or digital filter, because both the clock information and the data information representing the present value of $V_{IN}$ can be coupled to the DSP or digital filter using only a single optical isolator or other galvanic isolation device. This results in substantial cost savings, because galvanic isolation devices generally are very expensive.

FIG. 8 illustrates a circuit in which the 1-bit delta sigma ADC 100 of FIG. 1 is set up in a user application for Mode 3 operation. Referring to FIG. 8, three of the delta sigma ADCs 100 of FIG. 1 are labeled 100-1, 100-2, and 100-3 and are connected to simultaneously receive the output voltages of three transducers (or other circuits) 51-1, 51-2, and 51-3, respectively. Each of the three delta sigma ADCs has both of its mode control inputs M1 and M0 connected to the $V_{DD}$ voltage supply conductor and therefore operates in Mode 3. Each of the three delta sigma ADCs has its DATA output terminal connected directly to a corresponding data terminal of the DSP 36. DSP 36 produces a clock signal on conductor 44, which is connected directly to the CLK input terminal of each of the three delta sigma ADCs. Note that the external clock signal produced on conductor 13 by DSP 36 provides the external clock signal EXTCLK simultaneously for each of the three delta sigma ADCs. Therefore, the output signals DATA produced by each of the delta sigma ADCs representing the voltages of each of the three transducers are presented simultaneously to DSP 36 in synchronism with the external clock signal produced by DSP 36 on conductor 13. This avoids waste of processor time for the more frequent reading of DATA signals that otherwise would be required for unsynchronized or randomly arriving DATA signals.

Figure 9:
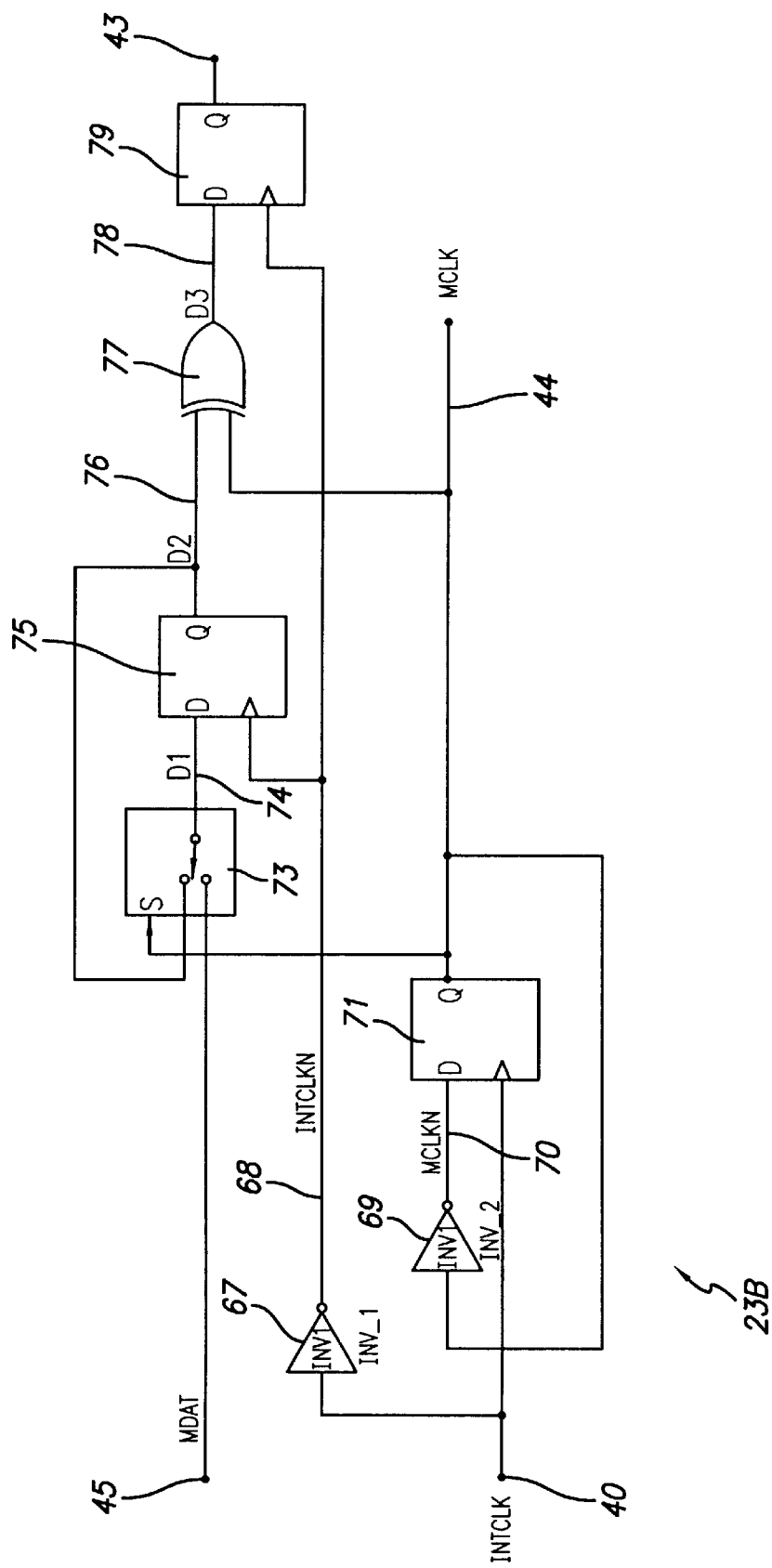
FIG. 9 is a diagram of the phase shift modulator 23B in FIG. 1.

FIG. 9 shows the details of the phase shift modulator circuit 23B in FIG. 1. Referring to FIG. 9, the phase shift modulator circuit 23B includes an input connected to conductor 40 of FIG. 1, which in Mode 2 conducts the internal clock signal INTCLK. Conductor 40 is connected to the input of an invertor 67 and to the clock input of a D type flip-flop 71. The D input of flip-flop 71 is connected to the output 70 of an inverter 69 having its input connected by conductor 44 to the Q output of flip-flop 71. Flip-flop 71 and inverter 69 operate to produce MCLK in response to INTCLK. The output 68 of invertor 67 is connected to the clock input of a D type flip-flop 75 and to the clock input of a D type flip-flop 79. The data signal MDAT produced on conductor 45 by delta sigma modulator 24 is applied to the first input of a multiplexer 73 having its output D1 applied to the D input of flip-flop 75. The output signal D2 of flip-flop 75 is applied by conductor 76 to the other input of multiplexer 73 and to one input of an exclusive OR gate 77. The select input of multiplexer 73 is connected to receive MCLK via conductor 44.

The other input of exclusive OR is connected to receive MCLK on conductor 44. The output signal D3 of the exclusive OR gate 77 is applied by conductor 78 to the D input of flip-flop 79. The output of flip-flop 79 is connected to the input of multiplexer 26 in FIG. 1 by conductor 43.

Each of D type flip-flops 71, 75 and 79 stores the logic level on its D input in response to the rising edges of its clock input. In Mode 2, flip-flop 71 divides the externally applied clock signal INTCLK coupled by multiplexer 22 of FIG. 1 from conductor 13 to conductor 40 in order to produce MCLK on conductor 44. For a pair of successive pulses of INTCLK including a first pulse and a second pulse, multiplexer 73 holds the previous value of MDAT during the falling edge of the first pulse, and flip-flop 75 stores the present value of MDAT present on conductor 45 in response to the falling edge of the second pulse. The output D3 of exclusive OR gate 77 is equal to the present level of MCLK if the signal D2 is equal to a "0", but is equal to the logical complement of MCLK if D2 is equal to a "1". Thus, phase shift circuit 23B accomplishes a phase shift of the signal on conductor 43 in the amount of half of the period of MCLK. Phase shift circuit 23 also eliminates the effect of voltage spikes that the output of exclusive OR gate 77.

Thus, the described delta sigma ADC 100 including delta sigma modulator 24 and interface circuit 1 of FIG. 1 is inexpensive and easy to implement, yet it can be used for four different modes of couplingdelta sigma modulator 24 to DSP 36 (or decimation filter 35 or the like) to provide the options of using an internally generated clock for a single delta sigma modulator, using an external clock for synchronizing multiple delta sigma modulators connected to measure multiple transducers, providing a half-frequency clock with data readable on both rising and falling edges of the clock, and single-line coupling of a phase-shift-modulated clock signal carrying both data information and clock information to a DSP or digital filter. Delta sigma ADC 100 is well suited for use in a variety of applications, including motor control applications, medical sensor measurement applications requiring galvanic decoupling, and the like.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention:

For example, the processor and/or filter described herein could be replaced by a simple counter circuit in some applications, such as simple display device applications.

Various alternative circuits can be provided for receiving the external EXTCLK signal and conducting CLK on different conductors rather than the same conductor as described above.

What is claimed is:

1. A multi-mode interface circuit for coupling a delta sigma modulator to a processor or digital filter, comprising:

(a) a decoder for decoding a plurality of mode selection inputs to produce a plurality of control signals;

(b) an oscillator receiving a first control signal from the decoder for producing a first internal clock signal in response to the first control signal;

(c) a first multiplexer having a first input coupled to receive an external clock signal and a second input coupled to receive the first internal clock signal and a selection input coupled to receive a second control signal from the decoder for selectively switching the first internal clock signal or the external clock signal to a first conductor to produce a second internal clock signal thereon;

(d) a code generator circuit receiving the second internal clock signal and a 1-bit data signal produced by the delta sigma modulator in response to an analog input signal producing a clock input signal to be applied to a clock input of the delta sigma modulator, a third internal clock signal, and a fourth internal clock signal in response to the second internal clock signal, and for producing a modulated signal in response to both the second internal clock signal and the 1-bit data signal;

(e) a second multiplexer having a first port coupled to receive the third internal clock signal, a second port coupled to receive the fourth internal clock signal, a third port coupled to a predetermined signal, and a selection input coupled to receive a third control signal from the decoder for selectively switching one of the third and fourth clock signals onto a clock conductor to produce an output clock signal thereon; and (f) a third multiplexer having a first input coupled to receive the modulated signal, a second input coupled to receive the 1-bit data signal, and a selection input coupled to receive a fourth control signal from the decoder for selectively switching the modulated signal or the 1-bit data signal onto a data output conductor to produce a data output signal thereon.

2. The multi-mode interface circuit of claim 1 wherein the second multiplexer has a fourth port coupled to the first input of the first multiplexer to provide the external clock signal thereto, and wherein the external clock signal, if present, is externally applied to the clock conductor while the second multiplexer couples the clock conductor to the fourth port.

3. The multi-mode interface circuit of claim 2 wherein the code generator circuit produces the clock input signal in response to the second internal clock signal, and wherein the code generator circuit includes a divider circuit that divides the clock input signal by 2 to produce the third internal clock signal and divides the clock signal by 4 to produce the fourth internal clock signal.

4. The multi-mode interface circuit of claim 3 wherein the code generator circuit includes a modulator circuit that modulates the clock input signal according to the 1-bit data signal to produce the modulated signal.

5. The multi-mode of claim 4 wherein the modulator circuit is a phase-shift-modulator circuit that phase-shift-modulates the clock input signal according to the 1-bit data signal to produce a phase-shift-modulated signal.

6. The multi-mode interface circuit of claim 1 wherein the predetermined signal is a ground signal.

7. The multi-mode interface circuit of claim 5 wherein the decoder has first and second mode selection inputs, and wherein the decoder decodes a first state of the first and second mode selection inputs to establish a first mode wherein the first control signal enables the oscillator to produce the first internal clock signal, wherein the second control signal causes the first multiplexer to switch the first internal clock signal to the first conductor, causing the code generator circuit to produce the clock input signal equal to the first internal clock signal, wherein the third control signal causes the second multiplexer to switch the third internal clock signal onto the clock conductor to produce the output clock signal equal to the third internal clock signal, and wherein the fourth control signal causes the third multiplexer to switch the 1-bit data signal onto the data output conductor.

8. The multi-mode interface circuit of claim 7 wherein the decoder decodes a second state of the first and second mode selection inputs to establish a second mode wherein the first control signal enables the oscillator to produce the first internal clock signal, wherein the second control signal causes the first multiplexer to switch the first internal clock signal to the first conductor, causing the code generator circuit to produce the clock input signal equal to the first internal clock signal, wherein the third control signal causes the second multiplexer to switch the fourth internal clock signal onto the clock conductor to produce the output clock signal equal to the fourth internal clock signal, and wherein the fourth control signal causes the third multiplexer to switch the 1-bit data signal onto the data output conductor.

9. The multi-mode interface circuit of claim 8 wherein the decoder decodes a third state of the first and second mode selection inputs to establish a third mode wherein the first control signal enables the oscillator to produce the first internal clock signal, wherein the second control signal causes the first multiplexer to switch the first internal clock signal to the first conductor, causing the code generator circuit to produce the clock input signal equal to the first internal clock signal, wherein a fifth control signal causes the second multiplexer to switch the predetermined signal onto the clock conductor, and wherein the fourth control signal causes the third multiplexer to switch the phase-shift-modulated signal onto the data output conductor.

10. The multi-mode interface circuit of claim 9 wherein the external clock signal is externally applied to the clock conductor, and wherein the decoder decodes a fourth state of the first and second mode selection inputs to establish a fourth mode wherein the first control signal disables the oscillator, wherein the fifth control signal causes the second multiplexer to switch the clock conductor to the fourth port to thereby apply the external clock signal to the first input of the first multiplexer, wherein the second control signal causes the first multiplexer to switch the external clock signal to the first conductor, causing the code generator circuit to produce the clock input signal in response to the external clock signal and wherein the fourth control signal causes the third multiplexer to switch the 1-bit data signal onto the data output conductor.

11. The multi-mode interface circuit of claim 9 wherein the decoder decodes a fourth state of the first and second mode selection inputs to establish a fourth mode wherein the first control signal disables the oscillator, wherein the second control signal causes the first multiplexer to switch the external clock signal to the first conductor, causing the code generator circuit to produce the clock input signal in response to the external clock signal, and wherein the fourth control signal causes the third multiplexer to switch the 1-bit data signal onto the data output conductor.

12. The multi-mode interface circuit of claim 1 wherein the oscillator is a RC oscillator circuit which is enabled by the first control signal.

13. A delta sigma analog-to-digital converter circuit comprising:
   (a) a delta sigma modulator receiving an analog input signal and a clock input signal for producing a 1-bit output signal representative of the analog input signal; and
   (b) a multi-mode interface circuit including
      i. a decoder for decoding a plurality of mode selection inputs to produce a plurality of control signals,
      ii. an oscillator circuit receiving a first control signal from the decoder for producing a first internal clock signal in response to the first control signal,
      iii. a first multiplexer having a first input coupled to do an external clock signal and a second input coupled to receive the first internal clock signal and a selection input coupled to receive a second control signal from the decoder for selectively switching the first internal clock signal or the external clock signal to a first conductor to produce a second internal clock signal thereon,
      iv. a code generator circuit receiving the second internal clock signal and the 1-bit data signal for producing the clock input signal, a third internal clock signal, and a fourth internal clock signal in response to the second internal clock signal, and for producing a phase-shift-modulated signal in response to both the second internal clock signal and the 1-bit data signal,
      v. a second multiplexer having a first port coupled to receive the third internal clock signal, a second port coupled to receive the fourth internal clock signal, a third port coupled to a predetermined signal, and a selection input coupled to receive a third control signal from the decoder for selectively switching one of the third and fourth clock signals onto a clock conductor to produce an output clock signal thereon; and
      vi. a third multiplexer having a first input coupled to receive the phase-shift-modulated signal, a second input coupled to receive the 1-bit data signal, and a selection input coupled to receive a fourth control signal from a decoder for selectively switching the phase-shift-modulated signal or the 1-bit data signal onto a data output conductor to produce a data output signal thereon.

14. The multi-mode interface circuit of claim 13 wherein the second multiplexer has a fourth port coupled to the first input of the first multiplexer to provide the external clock signal thereto, and wherein the external clock signal, if present, is applied to the clock conductor while the second multiplexer couples the clock conductor to the fourth port.

15. The multi-mode interface circuit of claim 13 wherein the code generator circuit produces the clock input signal in response to the second internal clock signal, and wherein the code generator circuit includes a divider circuit that divides the clock input signal by 2 to produce the third internal clock signal and divides the clock signal by 4 to produce the fourth internal clock signal.

16. The multi-mode interface circuit of claim 15 wherein the code generator circuit includes a phase-shift-modulator circuit that phase-shift-modulates the clock input signal according to the 1-bit data signal to produce the phase-shift-modulated signal.

17. The multi-mode interface circuit of claim 13 wherein the decoder has first and second mode selection inputs, and wherein the decoder decodes a first state of the first and second mode selection inputs to establish a first mode wherein the first control signal enables the oscillator to produce the first internal clock signal, wherein the second control signal causes the first multiplexer to switch the first internal clock signal to the first conductor, causing the code generator circuit to produce the clock input signal equal to the first internal clock signal, wherein the third control signal causes the second multiplexer to switch the third internal clock signal onto the clock conductor to produce the output clock signal equal to the third internal clock signal, and wherein the fourth control signal causes the third multiplexer to switch the 1-bit data signal onto the data output conductor.

18. The multi-mode interface circuit of claim 17 wherein the decoder decodes a second state of the first and second mode selection inputs to establish a second mode wherein the first control signal enables the oscillator to produce the first internal clock signal, wherein the second control signal causes the first multiplexer to switch the first internal clock signal to the first conductor, causing the code generator circuit to produce the clock input signal equal to the first internal clock signal, wherein the third control signal causes the second multiplexer to switch the fourth internal clock signal onto the clock conductor to produce the output clock signal equal to the fourth internal clock signal, and wherein the fourth control signal causes the third multiplexer to switch the 1-bit data signal onto the data output conductor.

19. The multi-mode interface circuit of claim 18 wherein the decoder decodes a third state of the first and second mode selection inputs to establish a third mode wherein the first control signal enables the oscillator to produce the first internal clock signal, wherein the second control signal causes the first multiplexer to switch the first internal clock signal to the first conductor, causing the code generator circuit to produce the clock input signal equal to the first internal clock signal, wherein a fifth control signal causes the second multiplexer to switch the predetermined signal onto the clock conductor, and wherein the fourth control signal causes the third multiplexer to switch the phase-shift-modulated signal onto the data output conductor.

20. The multi-mode interface circuit of claim 9 wherein the external clock signal is externally applied to the clock conductor, and wherein the decoder decodes a fourth state of the first and second mode selection inputs to establish a fourth mode wherein the first control signal disables the oscillator, wherein the fifth control signal causes the second multiplexer to switch the clock conductor to the fourth port to thereby apply the external clock signal to the first input of the first multiplexer, wherein the second control signal causes the first multiplexer to switch the external clock signal to the first conductor, causing the code generator circuit to produce the clock input signal in response to the external clock signal, and wherein the fourth control signal causes the third multiplexer to switch the 1-bit data signal onto the data output conductor.

21. The multi-mode interface circuit of claim 19 wherein the decoder decodes a fourth state of the first and second mode selection inputs to establish a fourth mode wherein the first control signal disables the oscillator, wherein the second control signal causes the first multiplexer to switch the external clock signal to the first conductor, causing the code generator circuit to produce the clock input signal in response to the external clock signal, and wherein the fourth control signal causes the third multiplexer to switch the 1-bit data signal onto the data output conductor.

22. The multi-mode interface circuit of claim 13 wherein the output clock signal and the data output signal are coupled to a DSP.

23. The multi-mode interface circuit of claim 13 wherein the output clock signal and the data output signal are coupled to a digital filter.

24. The multi-mode interface circuit of claim 20 wherein the decoder decodes the first state of the first and second mode selection inputs to establish the first mode, and wherein the input signal is produced by a transducer circuit that is electrically floating with respect to a ground voltage applied to a processor to which the output clock signal and the data output signal are coupled.

25. The multi-mode interface circuit of claim 24 wherein the output clock signal and the data output signal are coupled to the processor by means of galvanic isolation devices.

26. A method of coupling a delta sigma modulator to a processor or digital filter, comprising:
 (a) decoding a plurality of mode selection inputs to produce a plurality of control signals;
 (b) enabling an oscillator to produce a first clock signal in response to a first control signal;
 (c) multiplexing the first clock signal or an external clock signal in response to a second control signal to produce a second clock signal;
 (d) producing a clock input signal in response to the second clock signal and applying the second clock signal as an input to the delta sigma modulator causing it to produce a 1-bit data signal, and dividing the second clock signal to produce third and fourth clock signals;
 (e) phase-modulating the clock input signal in accordance with the 1-bit data signal to produce a phase-shift-modulated signal; and
 (f) multiplexing one of the third and fourth clock signals, and a predetermined signal to a clock conductor in response to a third control signal, and multiplexing one of the phase-shift-modulated signal and the 1-bit data signal to a data output conductor in response to a fourth control signal.

27. An interface circuit for coupling a delta sigma modulator to a processor, comprising:
 (a) decoding means for decoding a plurality of mode selection inputs to produce a plurality of control signals;
 (b) means for enabling an oscillator to produce a first clock signal in response to a first control signal;
 (c) first multiplexing means for multiplexing one of the first clock signal and an external clock signal in response to a second control signal to produce a second clock signal;
 (d) means for applying the second clock signal as a clock input signal to the delta sigma modulator causing it to produce a 1-bit data signal;
 (e) dividing means for dividing the second clock signal to produce third and fourth clock signals;
 (f) phase-modulating means for phase-modulating the clock input signal in accordance with the 1-bit data signal to produce a phase-shift-modulated signal;
 (g) second multiplexing means for multiplexing one of the third and fourth clock signals and a predetermined signal to a clock conductor in response to a third control signal; and
 (h) third multiplexing means for multiplexing one of the phase-shift-modulated signal and the 1-bit data signal to a data output conductor in response to a fourth control signal.

28. A method of coupling a delta sigma modulator to a processor or digital filter, comprising:
 (a) decoding a plurality of mode selection inputs to produce a plurality of control signals;
 (b) enabling an oscillator to produce a first clock signal in response to a first control signal;
 (c) multiplexing the first clock signal or an external clock signal in response to a second control signal to produce a second clock signal;
 (d) producing a clock input signal in response to the second clock signal and applying the second clock signal as an input to the delta sigma modulator causing it to produce a 1-bit data signal, and dividing the second clock signal to produce third and fourth clock signals;
 (e) modulating the clock input signal in accordance with the 1-bit data signal to produce a modulated signal;
 (f) selectively (1) multiplexing one of the third and fourth clock signals, and a predetermined signal to a clock conductor in response to a third control signal or (2) applying the external clock signal to the clock conductor and multiplexing the external clock signal from the clock conductor to a multiplexer used in performing step (c) in response to a fourth control signal; and
 (g) multiplexing one of the modulated signal and the 1-bit data signal to a data output conductor in response to a fourth control signal.

* * * * *